(12) United States Patent
Enoki et al.

(10) Patent No.: US 8,817,147 B2
(45) Date of Patent: Aug. 26, 2014

(54) PHOTOELECTRIC CONVERSION DEVICE, IMAGING APPARATUS, AND SOLAR CELL

(75) Inventors: Osamu Enoki, Kanagawa (JP); Ayumi Nihei, Tokyo (JP)

(73) Assignee: Sony Corporation, Tokyo (JP)

( * ) Notice: Subject to any disclaimer, the term of this patent is extended or adjusted under 35 U.S.C. 154(b) by 127 days.

(21) Appl. No.: 13/553,140

(22) Filed: Jul. 19, 2012

(65) Prior Publication Data
US 2013/0027593 A1 Jan. 31, 2013

(30) Foreign Application Priority Data

Jul. 28, 2011 (JP) ................. 2011-165184

(51) Int. Cl.
| | | |
|---|---|---|
| H04N 3/14 | (2006.01) | |
| H04N 5/335 | (2011.01) | |
| H01L 27/146 | (2006.01) | |
| H01L 51/00 | (2006.01) | |
| H04N 9/04 | (2006.01) | |
| H01L 51/42 | (2006.01) | |

(52) U.S. Cl.
CPC .......... *H01L 27/14632* (2013.01); *H04N 9/045* (2013.01); *H01L 27/14625* (2013.01); *H01L 51/4253* (2013.01); *H01L 51/0074* (2013.01); *H01L 27/14621* (2013.01); *Y02E 10/549* (2013.01)
USPC ...................................... 348/294; 348/207.99

(58) Field of Classification Search
CPC .. H04N 5/288; H04N 9/045; H01L 27/14621; H01L 27/14627; G03G 5/06
USPC ............................................ 348/294, 207.99
See application file for complete search history.

(56) References Cited

U.S. PATENT DOCUMENTS

| | | | | |
|---|---|---|---|---|
| 4,004,572 A | * | 1/1977 | Nathan et al. ................. | 126/714 |
| 5,310,614 A | * | 5/1994 | Yoshizawa et al. ......... | 430/58.15 |
| 2008/0246853 A1 | * | 10/2008 | Takizawa et al. .......... | 348/222.1 |
| 2010/0186816 A1 | * | 7/2010 | Park et al. ..................... | 136/256 |

FOREIGN PATENT DOCUMENTS

| | | |
|---|---|---|
| JP | 2003-332551 | 11/2003 |
| JP | 2005-303266 | 10/2005 |
| JP | 2006-100767 | 4/2006 |
| JP | 2007-081137 | 3/2007 |

* cited by examiner

*Primary Examiner* — Antoinette Spinks
(74) *Attorney, Agent, or Firm* — Dentons US LLP

(57) ABSTRACT

A photoelectric conversion device includes: a photoelectric conversion layer which includes a thioindigo derivative.

8 Claims, 5 Drawing Sheets

FIG.6A
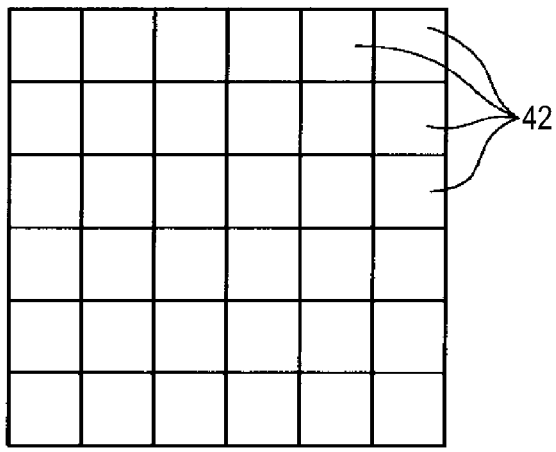
FIG.6B
| C | Y | C | Y | C | Y | ~44Y |
| Y | C | Y | C | Y | C | ~44C |
| C | Y | C | Y | C | Y | ~44Y |
| Y | C | Y | C | Y | C | ~44C |
| C | Y | C | Y | C | Y | |
| Y | C | Y | C | Y | C | |
FIG.7
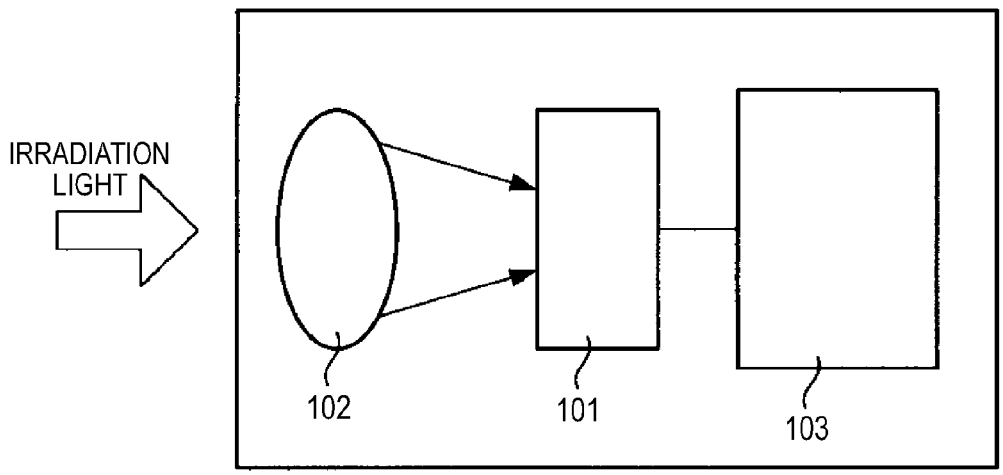

PHOTOELECTRIC CONVERSION DEVICE, IMAGING APPARATUS, AND SOLAR CELL

FIELD

The present technology relates to a photoelectric conversion device which employs an organic photoelectric conversion material, and in addition, relates to an imaging apparatus and a solar cell which are provided with the photoelectric conversion device.

BACKGROUND

In an image sensor with the configuration in the related art where a photodiode is provided on a silicon substrate and a color filter is formed thereon, the usage efficiency of light deteriorates since there is loss of light due to the color filter.

In addition, since the wavelength of light which is transmitted by the color filter is limited, an optical low pass filter is necessary in order to prevent the generation of false colors when reproducing colors and loss of light occurs also with the optical low pass filter.

In order to improve on such issues, a photoelectric conversion device which employs an organic photoelectric conversion material is proposed (for example, refer to JP-A-2003-332551, JP-A-2005-303266, and JP-A-2006-100767).

In a case where the photoelectric conversion device which employs an organic photoelectric conversion material is used in a color imaging apparatus (image sensor), it is possible to carry out photoelectric conversion of input light in an inner portion of the organic photoelectric conversion material without any loss due to the color filter occurring.

Due to this, it is possible to improve the use efficiency of light.

The photoelectric conversion device which employs an organic photoelectric conversion material is able to be configured by, for example, providing a photoelectric conversion film formed from an organic photoelectric conversion material between a first electrode and a second electrode and by using a conductive material which has light transparency on the electrode which is on the light irradiation side. As the conductive material which has light transparency, examples include ITO (Indium Tin Oxide) and the like, and normally, the conductive material has a large work function.

Here, in the photoelectric conversion devices which are proposed, an organic photoelectric conversion material such as a quinacridone derivative is used as the photoelectric conversion film. In a case where a quinacridone derivative is used, there is an advantage in that the efficiency of photoelectric conversion is improved.

However, since the ionization potential of quinacridone derivatives is small, hole injection leakage current is easily generated when a positive voltage is applied to an electrode with a large work function.

As a result, the current value is large even in a state where there is no light, that is, the current during darkness increases, and as a result, sensitivity is decreased.

Therefore, the application of a work function adjustment film and the like other than the photoelectric conversion film is proposed (for example, refer to JP-A-2007-81137) in order to reduce the hole injection leakage current and improve sensitivity.

SUMMARY

However, when a work function adjustment film and the like other than the photoelectric conversion film are applied and form multiple layers, the structure and the manufacturing process are complicated since the number of films has increased.

As a result, the material costs and the manufacturing costs increase.

In addition, when a work function adjustment film and the like are applied and form multiple layers, since interface resistance and the like have increased, the value of the photoelectric current which is a signal is also reduced and the quantum efficiency of the photoelectric conversion device is reduced.

It is therefore desirable to provide a photoelectric conversion device with a configuration where sufficient sensitivity and the realization of low costs are possible. It is also desirable to provide an imaging apparatus and a solar cell which are provided with the photoelectric conversion device.

A photoelectric conversion device according to one embodiment of the present technology has a photoelectric conversion layer formed to include a thioindigo derivative.

An imaging apparatus according to one embodiment of the present technology is provided with a solid state imaging device in which a plurality of pixels including photoelectric conversion sections are formed. The solid state imaging device includes a light concentrating optical section which concentrates incident light, a photoelectric conversion layer which is arranged above the photoelectric conversion sections and includes a thioindigo derivative, and an organic color filter layer which is arranged above the photoelectric conversion sections.

Furthermore, the imaging apparatus according to the embodiment of the present technology includes a signal processing section. The solid state imaging device carries out photoelectric conversion by receiving light which is concentrated by the light concentrating optical section. The signal processing section processes a signal which has been photoelectrically converted.

A solar cell according to one embodiment of the present technology generates an electromotive force due to light being irradiated onto the photoelectric conversion layer. The solar cell includes a first electrode made of a light transparent conductive material, a second electrode, and a photoelectric conversion layer, which is interposed between the first electrode and the second electrode and includes a thioindigo derivative.

According to the configuration of the photoelectric conversion device of the embodiment of the present technology described above, the ionization potential of the photoelectric conversion layer is higher since there is a photoelectric conversion layer which includes a thioindigo derivative.

Due to this, it is possible to suppress the generation of current during darkness due to the hole injection leakage current.

Then, since suppression of the generation of current during darkness due to the hole injection leakage current is possible only in the photoelectric conversion layer, it is not necessary for multiple layers to be formed by providing a work function adjustment film and the like for suppressing hole injection.

According to the configuration of the imaging apparatus according to the embodiment of the present technology described above, the photoelectric conversion layer which includes a thioindigo derivative and a solid state imaging device where an organic color filter layer is arranged above photoelectric conversion sections are provided.

Due to this, in the photoelectric conversion layer, it is possible to suppress the generation of current during darkness due to the hole injection leakage current.

Then, since suppression of the generation of current during darkness due to the hole injection leakage current is possible only in the photoelectric conversion layer, it is not necessary for multiple layers to be formed by providing a work function adjustment film and the like for suppressing hole injection.

According to the configuration of the solar cell according to the embodiment of the present technology described above, the photoelectric conversion layer which includes a thioindigo derivative is provided.

Due to this, in the photoelectric conversion layer, it is possible to suppress the generation of current during darkness due to the hole injection leakage current.

Then, since suppression of the generation of current during darkness due to the hole injection leakage current is possible only in the photoelectric conversion layer, it is not necessary for multiple layers to be formed by providing a work function adjustment film and the like for suppressing hole injection.

According to the embodiments of the present technology described above, it is possible to improve sensitivity since it is possible to suppress the generation of current during darkness due to hole injection leakage current.

Since it is not necessary to form multiple layers by providing a work function adjustment film and the like for suppressing hole injection, it is possible to simplify the configuration of the photoelectric conversion device and the solid state imaging device which include the photoelectric conversion layer and it is possible to achieve a reduction in material costs and manufacturing costs.

In addition, according to the embodiments of the present technology, it is possible to realize a photoelectric conversion device and an imaging apparatus with a configuration where sufficient sensitivity and manufacturing with low costs are possible.

BRIEF DESCRIPTION OF THE DRAWINGS

FIGS. 6A and 6B are views illustrating a planar arrangement of an organic photoelectric conversion film and an organic color filter layer of the solid state imaging device of FIG. 5.

FIG. 7 is an outline configuration view (block diagram) of an imaging apparatus according to the second embodiment.

DETAILED DESCRIPTION

Below, preferable embodiments for realizing the present technology (referred to below as the embodiments) will be described.

Here, the description will be performed in the sequence below.

1. First Embodiment (Photoelectric Device)
2. Second Embodiment (Solid State Imaging Device and Imaging Apparatus)
3. Third Embodiment (Solar Cell)

<1. First Embodiment (Photoelectric Device)>

Figure 1:
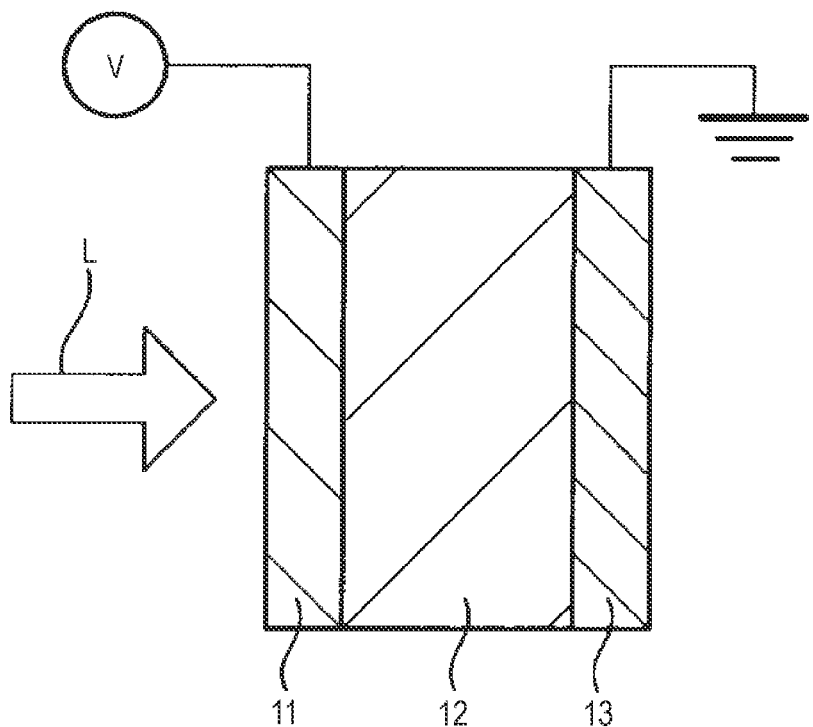
FIG. 1 is an outline configuration view (cross-sectional view) of a photoelectric conversion device according to a first embodiment.

An outline configuration view (cross-sectional view) of a photoelectric conversion device according to a first embodiment is shown in FIG. 1.

A photoelectric conversion device 10 shown in FIG. 1 is configured by interposing a photoelectric conversion layer 12, which is formed from an organic material, between a light transparent electrode 11 and an opposing electrode 13.

As the material of the light transparent electrode 11, for example, it is possible to use a light transparent conductive material such as ITO (Indium Tin Oxide), tin oxide, zinc oxide, or titanium oxide.

As the material of the opposing electrode 13, for example, it is possible to use a metal element such as Al, Pt, Pd, Cr, Ni, Ag, Ta, W, Cu, Ti, In, Sn, Fe, Co, or Mo, or an alloy or the like which includes these metal elements.

The light transparent conductive material has a large work function, and since the light transparent electrode 11 acts as an anode electrode which extracts electrons, a material which acts as a cathode electrode which extracts holes and has a small work function is used in the opposing electrode 13.

In the photoelectric conversion device 10 of the embodiment, in particular, a thioindigo derivative is used as the material of the photoelectric conversion layer 12.

As the thioindigo derivative, for example, it is possible to use a group of substances with the structures shown below.

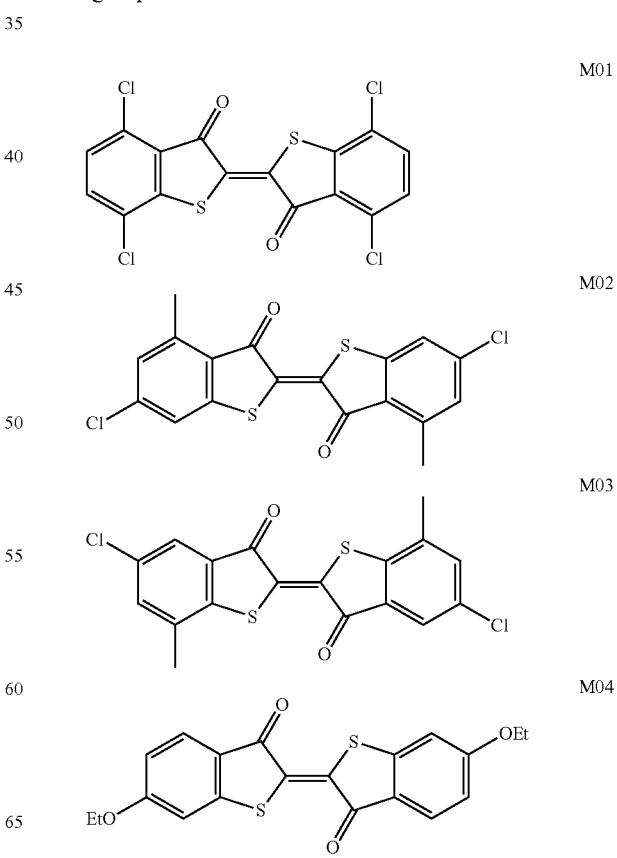

M05
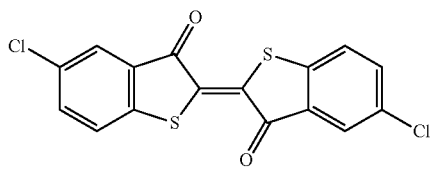

M06
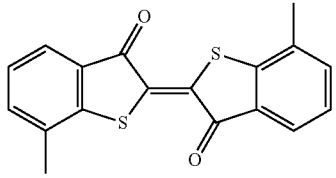

M07
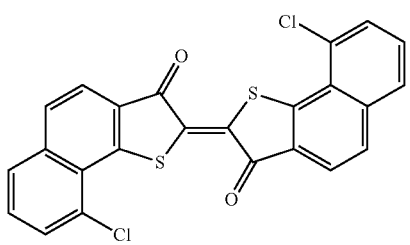

M08
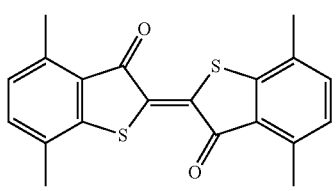

M09
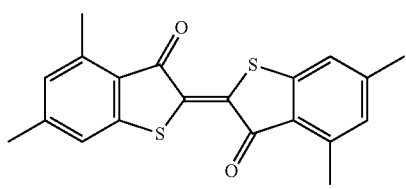

M10
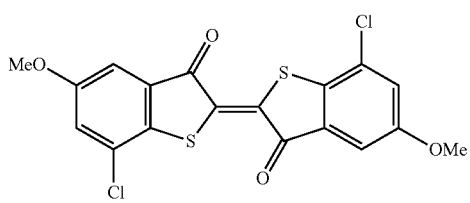

M11
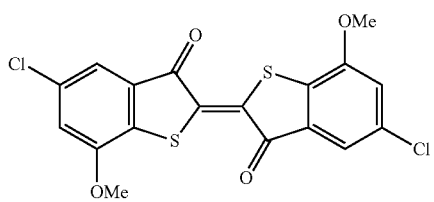

M12
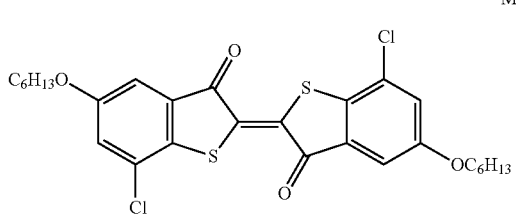

M13
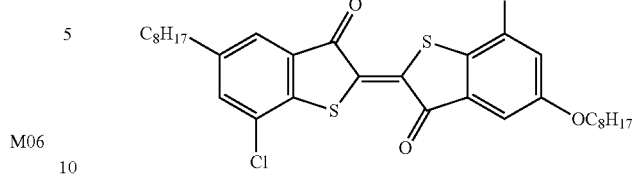

In addition, other than the group of substances described above, it is possible to use a thioindigo derivative with the structure (1) below. Here, among the group of substances described above, the configuration of M07 is not included in the structure (1) below.

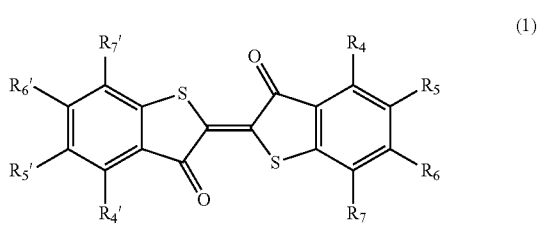

(1)

Here, the portions of $R_4$ to $R_7$ and $R_4'$ to $R_7'$ are arbitrary elements or arbitrary groups, but typically, are hydrogen, a halogen such as chlorine, or a methyl group.

More preferably, the thioindigo derivative contains at least one or more electron withdrawing groups as substituents.

As the electron withdrawing group, examples include a halogen (Cl, Br, I), a cyano group (—CN), a nitro group (—NO$_2$), a phenyl group, or the like.

The group of substances described above is equivalent to M01 to M03, M05, M07, and M10 to M13.

In a case of the thioindigo derivative with the structure (1) described above, at least one of $R_4$ to $R_7$ and $R_4'$ to $R_7'$ is an electron withdrawing group.

By including at least one or more electron withdrawing group as the substituent, it is possible to increase the ionization potential compared to a case where an electron withdrawing group is not included.

Even more preferably, a thioindigo derivative where the ionization potential is −6.0 eV or less is used. Due to the ionization potential being −6.0 eV or less and the absolute value of the ionization potential being large, the effect of suppressing the generation of hole injection leakage current is increased.

Due to the thioindigo derivative being used as the material of the photoelectric conversion layer 12, since the thioindigo derivative has a large ionization potential, it is possible to suppress the generation of hole injection leakage current and it is possible to improve the sensitivity by reducing the current during darkness.

In regard to the photoelectric conversion device 10 of the embodiment, as shown in FIG. 1, if a voltage is applied between the light transparent electrode 11 and the opposing electrode 13, a current is generated in the photoelectric conversion layer 12 and the photoelectric conversion layer 12 becomes a photoconductor, and it is possible to be used in a light sensor, an imaging apparatus, or the like. Then, a current with an amount which corresponds to the amount of irradiation of light L is obtained.

On the other hand, if a voltage is not applied between the light transparent electrode 11 and the opposing electrode 13 and only the irradiation of the light L is performed, it is possible to extract a photoelectromotive force using the photoelectric conversion device 10 and an effect as a solar cell is possibly achieved.

Figure 2:
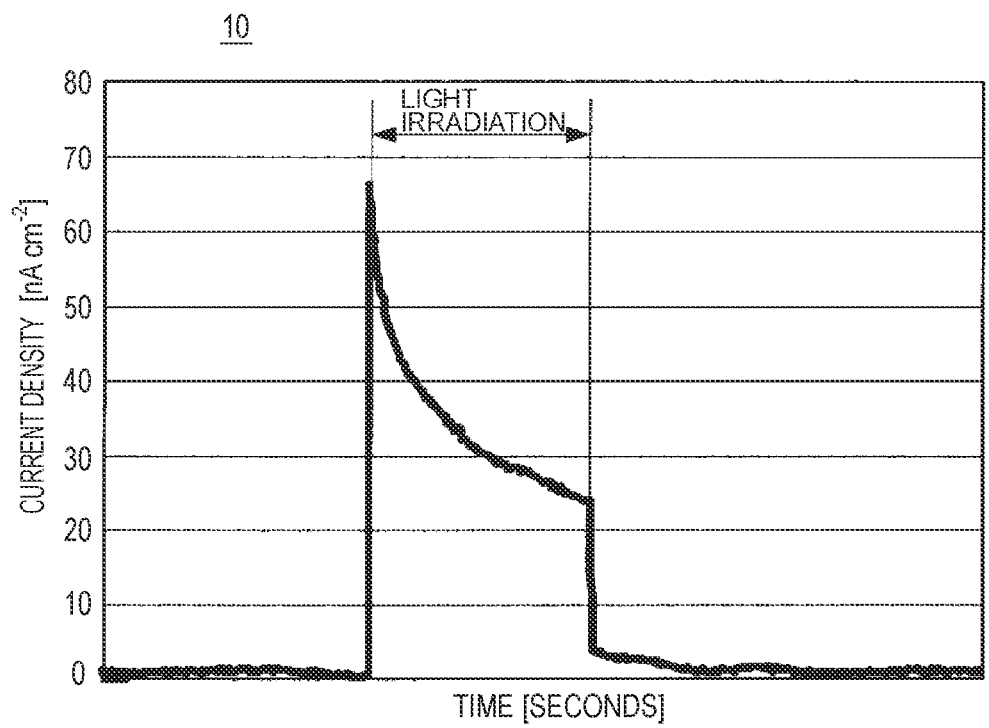
FIG. 2 is a view illustrating a change in current density when light is irradiated by a voltage being applied between electrodes on both sides of the photoelectric conversion device of FIG. 1.

Here, a change in current density is shown in FIG. 2 when a voltage is applied between the electrodes 11 and 13 of both sides and the light L is irradiated in a case where the photoelectric conversion device 10 of FIG. 1 is used as a light sensor.

As shown in FIG. 2, the current value increases according to the light irradiation.

The response waveform of the current density is high at the start of irradiation, gradually falls as the irradiation time elapses, and sharply drops when irradiation ends.

In this manner, since the current which is generated changes as the irradiation time elapses, a light sensor with superior detection sensitivity is possible if, for example, a method which is described in JP-A-2010-040783 is used.

That is, for example, as described in JP-A-2010-040783, a time constant $\tau(P)$ in the current declining time is calculated using a current detection circuit and a current $I_{dec}$ in the current declining time may be calculated by equation (2) below using the time constant.

$$I_{dec} = C_1 \cdot I_0(P) \cdot \exp[-t/\tau(P)] + C_2 \quad (2)$$

Here, t indicates the elapsed time from the current reduction period start timing (t=0) when the time of progression to the current reduction period from a current increasing period in the current change is set as t=0. $I_0(P)$ indicates the amount of current which is generated in the photoelectric conversion layer when a fixed amount of light is irradiated onto the photoelectric conversion layer at t=0. $C_1$ and $C_2$ are constants.

Figure 3:
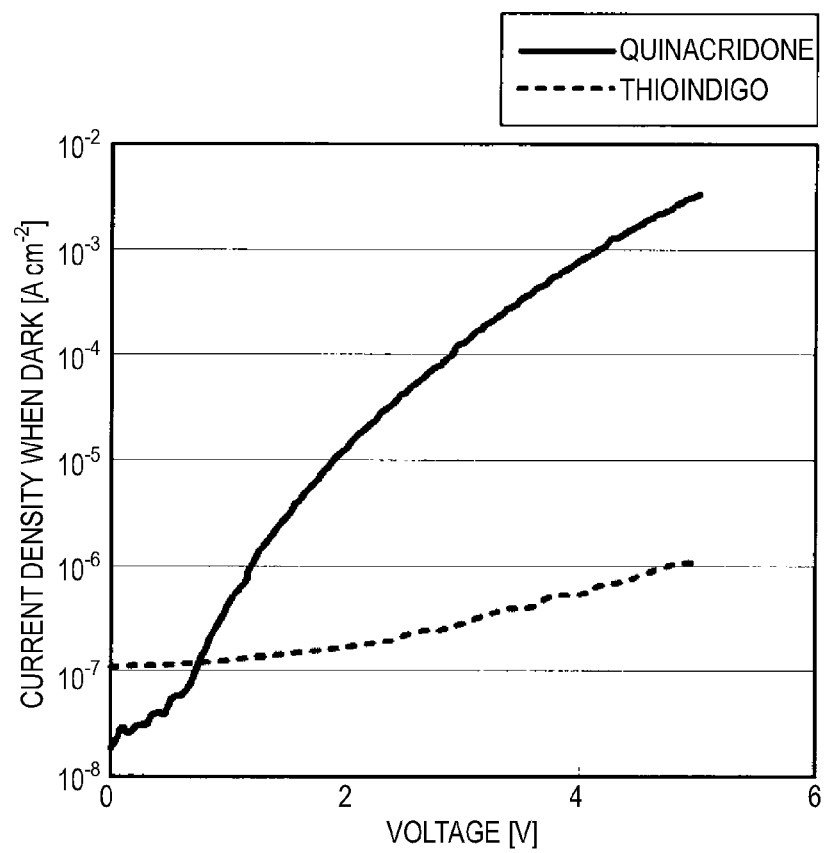
FIG. 3 is a view comparing current densities when dark of a case where a thioindigo derivative is used as the material of the photoelectric conversion layer and a case where a quinacridone derivative is used as the material of the photoelectric conversion layer.

Here, a comparison of current densities when dark in a case of the embodiment where a thioindigo derivative is used as the material of the photoelectric conversion layer and a case of a comparative example where a quinacridone derivative is used as the material of the photoelectric conversion layer is shown in FIG. 3.

As is understood from FIG. 3, in a case where the quinacridone derivative is used, the current during darkness sharply increases when the applied voltage is increased due to the injection current from the electrode.

On the other hand, in a case where the thioindigo derivative is used, the current during darkness hardly increases even when a high voltage is applied since the injection from the electrode is suppressed.

Figures 4A, 4B:
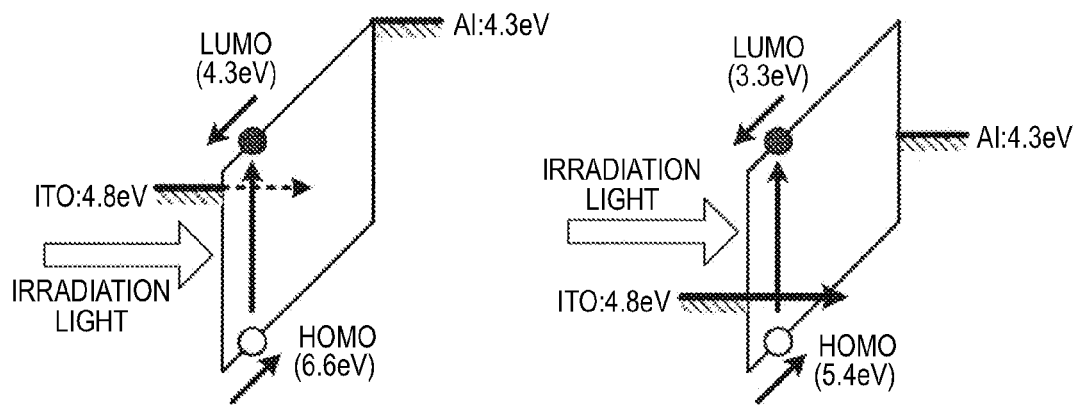
FIGS. 4A and 4B are energy graphs in a case where each of the materials is used as shown in FIG. 3.

In addition, in a case where two materials of the photoelectric conversion layer 12 shown in FIG. 1 are used, the respective energy graphs are shown in FIGS. 4A and 4B. FIG. 4A shows the energy graph in a case where the thioindigo derivative is used and FIG. 4B shows the energy graph in a case where the quinacridone derivative is used. In either case, the light transparent electrode 11 is configured using ITO and the opposing electrode 13 is configured using Al.

Here, since the main carriers in the organic film are typically holes, it is predicted that the effect of the electron injection from the Al of the opposing electrode 13 will be small.

As shown in FIG. 4A, in a case where the thioindigo derivative is used, it is difficult for hole injection from the ITO of the light transparent layer 11 to occur since the ionization potential of the photoelectric conversion layer 12 ($\approx$HOMO=6.6 eV) is high.

On the other hand, as shown in FIG. 4B, in a case where the quinacridone derivative is used, it is easy for hole injection from the ITO of the light transparent layer 11 to occur since the ionization potential of the photoelectric conversion layer 12 ($\approx$HOMO=5.4 eV) is low and the dark current increases.

Accordingly, due to the use of the thioindigo derivative, it is possible to reduce the dark current compared to the quinacridone derivative which is used in the related art.

According to the configuration of the photoelectric conversion device 10 of the embodiment described above, due to the thioindigo derivative being used as the material of the photoelectric conversion layer 12, the ionization potential of the photoelectric conversion layer 12 is higher. Due to this, it is possible to suppress the generation of current during darkness due to hole injection leakage current from the light transparent electrode 11.

In this manner, since it is possible to suppress the generation of current during darkness due to hole injection leakage current only in the photoelectric conversion layer 12, it is not necessary to form multiple layers by providing a work function adjustment film and the like for suppressing hole injection.

As a result, it is possible to simplify the configuration of the photoelectric conversion device 10 and it is possible to reduce the material costs. In addition, since it is possible to simplify the manufacturing apparatus without a manufacturing apparatus with a complicated configuration being necessary, it is possible to reduce the number of manufacturing processes compared to a configuration with multiple layers and it is possible to achieve a reduction in the manufacturing costs.

In addition, according to the configuration of the photoelectric conversion device 10 of the embodiment, due to the photoelectric conversion layer 12 where the thioindigo derivative is used being provided, it is possible to carryout photoelectric conversion of irradiated light in an inner portion of the photoelectric conversion layer 12 without generating any loss due to a filter or the like.

Furthermore, since multiple layers are not necessary, it is possible to suppress a reduction in the extraction efficiency of the photoelectric current due to interface resistance.

For these reasons, it is possible to improve the usage efficiency of light and improve sensitivity.

Accordingly, according to the configuration of the photoelectric conversion device 10 of the embodiment, it is possible to realize the photoelectric conversion device 10 with a configuration where sufficient sensitivity and manufacturing with low costs are possible.

<2. Second Embodiment (Solid State Imaging Device and Imaging Apparatus)>

Figure 5:
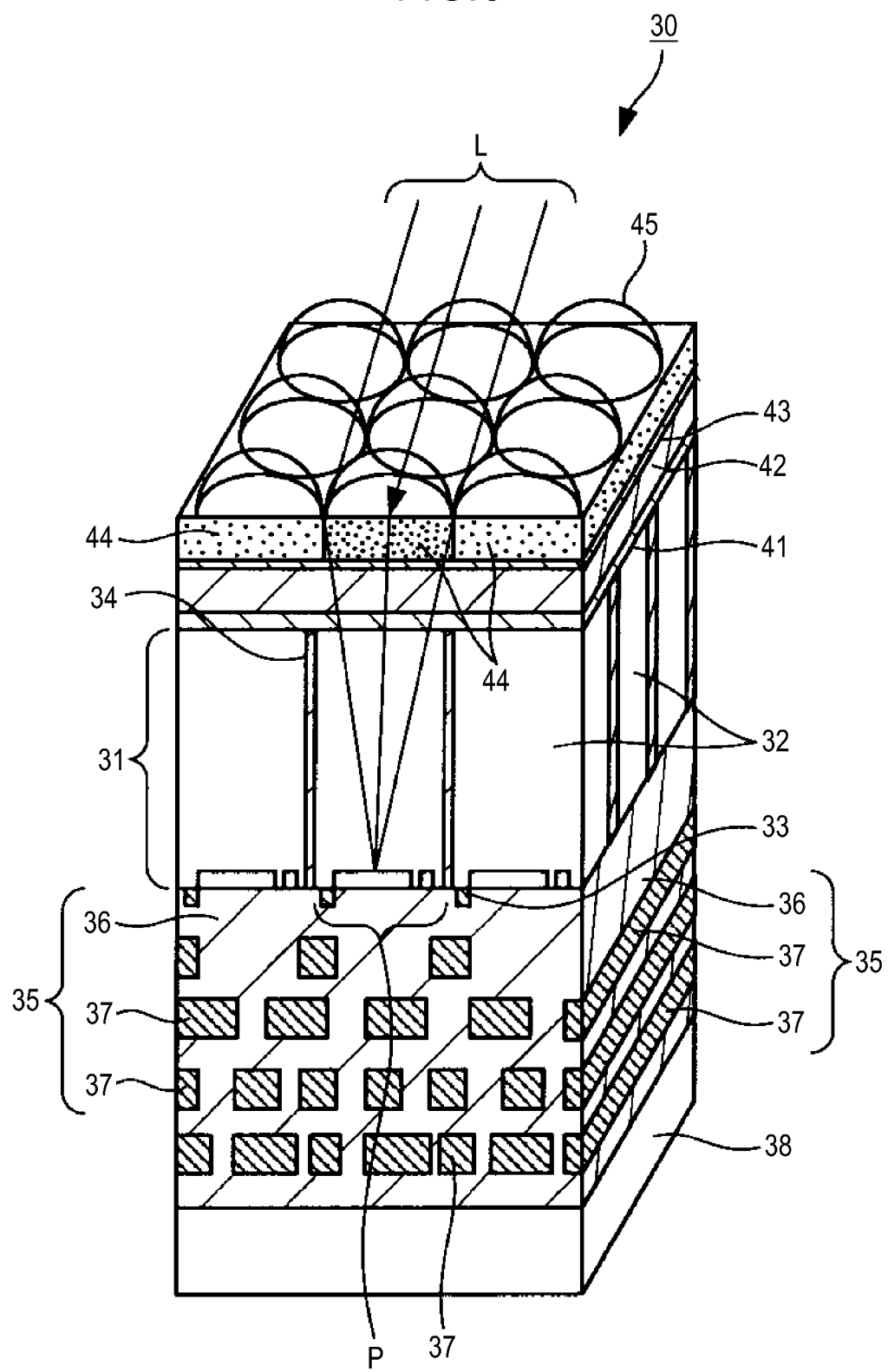
FIG. 5 is an outline configuration view (perspective view which shows a partial cross section) of a solid state imaging device according to a second embodiment.

An outline configuration view (perspective view which shows a partial cross section) of a solid state imaging device according to a second embodiment is shown in FIG. 5.

The embodiment is a case where the present technology is applied to a solid state imaging device of a CMOS type and an imaging apparatus where the solid state imaging device is provided.

A solid state imaging device 30 shown in FIG. 5 is formed from, for example, a plurality of pixels P which have a photoelectric conversion section 32 which is formed from a photodiode and converts the incident light L to an electrical signal and a transistor group 33 on a semiconductor substrate 31 such as a silicon substrate.

The transistor group 33 is a transfer transistor, an amplitude transistor, a reset transistor, or the like and a portion thereof is shown in FIG. 5. Source and drain regions are formed on the semiconductor substrate 31 and a gate electrode is formed at a lower side of the semiconductor substrate 31. In the semiconductor substrate 31, a signal processing section which processes a signal charge which is read out from each of the photoelectric conversion sections 32 is formed in a portion which is not shown.

A device separating region 34 is formed in a portion between the pixels P which are adjacent in the semiconductor substrate 31. The device separating region 34 is able to be formed using, for example, a semiconductor region with a high concentration (for example, a p type) with the opposite conduction type to the photoelectric conversion section 32 (for example, n types).

In the lower side of the semiconductor substrate 31, a wiring section 35, which is formed from a plurality of layers of wiring layers 37 and insulation layers 36 therebetween, is formed.

Under the wiring section 35, for example, a support substrate 38 formed from a silicon substrate is formed.

At an upper side of the semiconductor substrate 31, a first electrode 41 with light transparency is formed.

Above the first electrode 41, an organic photoelectric conversion film 42 formed from an organic photoelectric conversion material is formed as the photoelectric conversion layer.

Furthermore, on the organic photoelectric conversion film 42, an organic color filter layer 44 is formed via a second electrode 43 with light transparency. The organic color filter layer 44 is formed to correspond to the photoelectric conversion sections 32, and for example, is formed by arranging a cyan color filter and a yellow color filter.

On the organic color filter layer 44, a light concentrating lens 45 which concentrates the incident light L to the photoelectric conversion section 32 is formed.

As the material for the first electrode 41 and the second electrode 43 which have light transparency, it is possible to use a light transparent conductive material such as ITO (indium tin oxide), tin oxide, aluminum zinc oxide, gallium zinc oxide, and indium zinc oxide. In addition, it is also possible to use $CuI$, $InSbO_4$, $ZnMgO$, $CuInO_2$, $MgIn_2O_4$, $CdO$, $ZnSnO_3$, or the like.

Here, it is possible for the first electrode 41 and the second electrode 43 to be either formed from the same material or formed from different materials.

Here, it is preferable that the first electrode 41 under the organic photoelectric conversion film 42 to have a configuration which is separated for each pixel.

In a state where a voltage is applied between the first electrode 41 and the second electrode 43, it is possible to detect the amount of the incident light L which is irradiated onto the organic photoelectric conversion film 42 by obtaining the current which corresponds to the amount of the incident light L.

Then, in the embodiment, in particular, as the material of the organic photoelectric conversion film 42, the thioindigo derivative is used. More preferably, the thioindigo derivative contains at least one or more electron withdrawing groups as substituents. As the electron withdrawing group, examples include a halogen (Cl, Br, I), a cyano group (—CN), a nitro group (—$NO_2$), a phenyl group, or the like.

Since the thioindigo derivative has a large ionization potential, it is possible to suppress the generation of hole injection leakage current and it is possible to improve the sensitivity by reducing the current during darkness.

The solid state imaging device 30 shown in FIG. 5 has a configuration which extracts green using the organic photoelectric conversion film 42 and which extracts blue and red using a combination of the cyan and yellow organic color filter layers 44.

Here, a form of the planar arrangement (coating) of the organic photoelectric conversion film 42 and the organic color filter layer 44 is shown in FIGS. 6A and 6B. FIG. 6A shows the organic photoelectric conversion film 42 and FIG. 6B shows the organic color filter layer 44.

As shown in FIG. 6A, the organic photoelectric conversion film 42 which extracts green is arranged for all pixels.

In addition, as shown in FIG. 6B, a cyan color filter 44C and a yellow color filter 44Y are arranged in a so-called checkered pattern arrangement.

A red component is removed by absorption using the cyan color filter 44C, a green component is removed by absorption using the organic photoelectric conversion film 42, and it is possible for blue to be extracted as the remaining blue component.

The blue component is removed by absorption using the yellow color filter 44Y, a green component is removed by absorption using the organic photoelectric conversion film 42, and it is possible for red to be extracted as the remaining red component.

Due to the configuration above, in the solid state imaging device 30 of the embodiment, it is possible to output color signals which are separated into blue, red, and green.

Here, the planar arrangement (coding) of the organic color filter 44 is not limited to a checkered pattern arrangement as shown in FIG. 6B and other arrangements are possible.

In the embodiment, furthermore, an imaging apparatus which is provided with the solid state imaging device is configured.

An outline configuration view (block diagram) of the imaging apparatus according to the second embodiment is shown in FIG. 7.

As shown in FIG. 7, an imaging apparatus 100 of the embodiment is formed to have an imaging section 101, an image formation optical system 102, and a signal processing section 103. Then, the imaging section 101 is provided with the solid state imaging device (which is not shown).

At the light concentrating side of the imaging section 101, the image formation optical system 102 which forms an image is provided as a light concentrating optical section which concentrates the incident light, and in addition, in the imaging section 101, the signal processing section 103, which has a driving circuit which drives the imaging section 101, the signal processing circuit which processes the signal which is photoelectrically converted by the solid state imaging device, and the like, is connected.

It is possible for the image signal which is processed using the signal processing section 103 to be stored using an image storage section (which is not shown).

As a specific product of the imaging apparatus 100, for example, there are a video camera, a digital still camera, a camera in a mobile phone, or the like.

Then, in the embodiment, the solid state imaging device 30 shown in FIG. 5 is used in the imaging section 101 of the imaging apparatus 100.

Due to the solid state imaging device 30 shown in FIG. 5 being used in the imaging section 101 of the imaging apparatus 100, the solid state imaging device 30 has the organic photoelectric conversion film 42 formed from the thioindigo derivative.

Due to this, since the thioindigo derivative has a large ionization potential, it is possible to suppress the generation of hole injection leakage current and it is possible to improve the sensitivity by reducing the current during darkness.

According to the configuration of the imaging apparatus 100 of the embodiment described above, the solid state imaging device 30 which has the organic photoelectric conversion film 42 formed from the thioindigo derivative is used in the imaging section 101. Due to this, since it is possible to suppress the generation of hole injection leakage current in the organic photoelectric conversion film 42, it is possible to improve the sensitivity by reducing the current during darkness due to the hole injection leakage current.

Then, it is possible to suppress the generation of the current during darkness only in the organic photoelectric conversion film 42 and it is not necessary to provide a work function adjustment film and the like for suppressing hole injection.

In addition, in the organic photoelectric conversion film 42 containing the thioindigo derivative, it is possible to receive and detect green light.

Due to this, compared to a configuration where the organic photoelectric conversion film is not used and only the organic color filter layer is provided, it is possible to reduce the loss of green light in the organic color filter layer and it is possible to improve usage efficiency and improve sensitivity with regard to green light.

Accordingly, according to the configuration of the imaging apparatus 100 of the embodiment, it is possible to realize an imaging apparatus with sufficient sensitivity with regard to green light with a simple configuration.

Here, in the embodiment described above, there is a configuration where the organic photoelectric conversion film 42 is formed in green, and blue and red are extracted by combining the cyan color filter 44C and the yellow color filter 44Y, but it is not problematic if the configuration where blue and red are extracted is another configuration.

In addition, in the embodiment described above, there is a configuration where light is irradiated from the opposite side of the wiring section 35 to the photoelectric conversion section 32 of the semiconductor substrate 31 (a so-called front irradiation type configuration), but it is possible to apply the present technology also to a configuration where light is irradiated from the same side as the wiring section (a so-called rear irradiation type configuration).

In addition, it is not problematic if the lamination order of the organic photoelectric conversion film 42 and the organic color filter layer 44 is reversed and there is a configuration where the organic color filter layer 44 is close to the semiconductor substrate 31.

In the solid state imaging device 30 of FIG. 5, the organic photoelectric conversion film 42 is configured to be formed continuously and uniformly over the plurality of pixels.

On the other hand, a configuration is possible where a separation region is formed on portions between the pixels in the organic photoelectric conversion film and the organic photoelectric conversion film is separated for each pixel.

As the separation region, for example, a configuration is possible where an impurity such as oxygen, nitrogen, helium, argon, or hydrogen is injected into the organic photoelectric conversion film and the physical properties (conductivity, refractive index, optical absorption, or the like) of the organic photoelectric conversion film or the molecular bonds are changed. In addition, a configuration is possible where a groove is formed in the organic photoelectric conversion film and the groove is filled in using an insulation material with different optical properties (absorption or reflection properties) to the material of the organic photoelectric conversion film.

In the embodiment described above, there is a configuration where the solid state imaging device 30 of FIG. 5 is used in the imaging section 101 of the imaging apparatus 100, but the configuration of the solid state imaging device which is used in the imaging section is not limited to the configuration of the solid state imaging device 30 of FIG. 5 and other configurations are possible.

As the material of the photoelectric conversion film, it is not problematic if the same material as in the solid state imaging device 30 of FIG. 5 is used in the imaging section 101 of the imaging apparatus 100 of FIG. 7 as long as it is a solid state imaging apparatus with the configuration where the thioindigo derivative is used.

The solid state imaging device 30 may be a form which is formed as one chip or may be a module form which has an imaging function where an imaging section and a signal processing section or an optical system are combined and packaged.

In the present technology, the "imaging apparatus" indicates, for example, a camera or a portable device with an imaging function. In addition, "imaging" is not only the taking of images when imaging with a normal camera but includes fingerprint detection and the like as a broader meaning.

<3. Third Embodiment (Solar Cell)>

Figure 8:
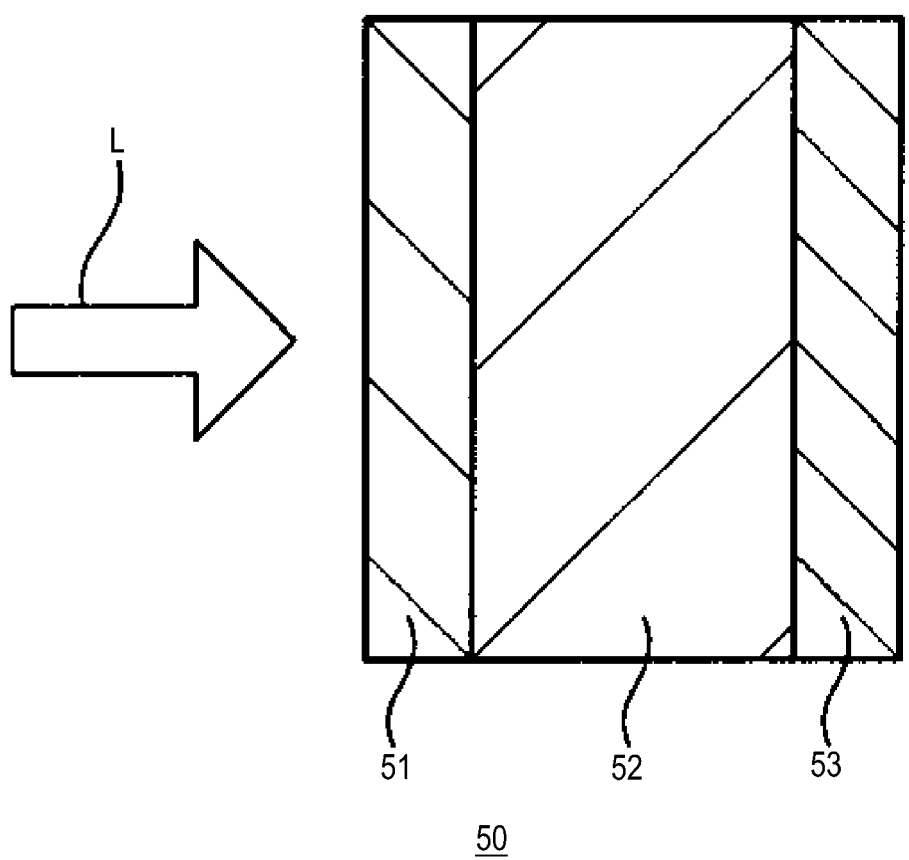
FIG. 8 is an outline configuration view (cross-sectional view) of a solar cell according to a third embodiment.

An outline configuration view (cross-sectional view) of a solar cell according to a third embodiment is shown in FIG. 8.

A solar cell 50 shown in FIG. 8 is configured by interposing a photoelectric layer 52 formed from an organic material between a first electrode (light transparent electrode) 51 made of a light transparent material and a second electrode (opposing electrode) 53.

As the material of the first electrode (light transparent electrode) 51, for example, it is possible to use a light transparent conductive material such as ITO (Indium Tin Oxide), tin oxide, zinc oxide, or titanium oxide.

As the material of the second electrode (opposing electrode) 53, for example, it is possible to use a metal element such as Al, Pt, Pd, Cr, Ni, Ag, Ta, W, Cu, Ti, In, Sn, Fe, Co, or Mo, or an alloy or the like which includes these metal element.

The light transparent conductive material has a large work function, and since the first electrode (light transparent electrode) 51 acts as an anode electrode which extracts electrons, a material with a small work function which is used as the cathode electrode which extracts holes is used in the second electrode (opposing electrode) 53.

In the solar cell 50 of the embodiment, in particular, a thioindigo derivative is used as the material of the photoelectric conversion layer 52. More preferably, the thioindigo derivative is configured to include at least one or more electron withdrawing groups as substituents. As the electron withdrawing group, examples include a halogen (Cl, Br, I), a cyano group (—CN), a nitro group (—NO$_2$), a phenyl group, or the like.

In the solar cell 50 of the embodiment, as shown in FIG. 8, it is possible to extract an electromotive force using the solar cell 50 due to the irradiation of the light L.

According to the configuration of the solar cell 50 of the embodiment described above, by providing the photoelectric conversion layer 52 which uses the thioindigo derivative, it is possible to obtain an electromotive force by carrying out photoelectric conversion on the input light L in an inner portion of the photoelectric conversion layer 52.

Then, since the photoelectric conversion layer 52 contains the thioindigo derivative, in the photoelectric conversion layer 52, it is possible to improve the open circuit voltage by suppressing the generation of current during darkness due to hole injection leakage current since it is possible to suppress the generation of hole injection leakage current. Due to this, it is possible to improve the ratio of the generation amount (generation efficiency) of the solar cell 50 with regard to the light amount of the irradiation light.

Furthermore, since multiple layers are not necessary, it is possible to suppress the reduction in the extraction efficiency of the photoelectric conversion due to interface resistance.

The present technology may be implemented as the following configurations.

1. A photoelectric conversion device which has a photoelectric conversion layer which includes a thioindigo derivative.
2. The photoelectric conversion device of the item 1 described above, wherein the thioindigo derivative contains at least one or more electron withdrawing groups.
3. The photoelectric conversion device of the item 1 described above, wherein the thioindigo derivative has the following structure (1):

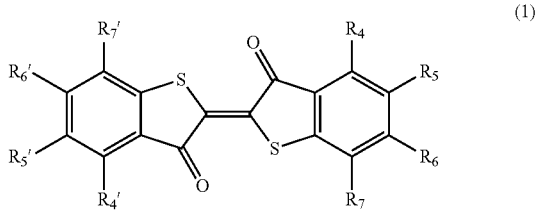

(the portions of $R_4$ to $R_7$ and $R_4'$ to $R_7'$ are arbitrary elements or arbitrary groups).

4. The photoelectric conversion device of the item 3 described above, wherein at least one or more of $R_4$ to $R_7$ and $R_4'$ to $R_7'$ in the structure (1) are electron withdrawing groups.
5. An imaging apparatus including a light concentrating optical section which concentrates incident light; a solid state imaging device which in which a plurality of pixels including photoelectric conversion sections are formed, which includes a photoelectric conversion layer which is arranged above the photoelectric conversion sections and includes a thioindigo derivative and an organic color filter which is arranged above the photoelectric conversion sections, and carries out photoelectric conversion by receiving light which is concentrated by the light concentrating optical section; and a signal processing section which processes the signal which has been photoelectrically converted.
6. The imaging apparatus of the item 5 described above, wherein the thioindigo derivative of the photoelectric conversion layer includes at least one or more electron withdrawing groups.
7. A solar cell, which generates electromotive power due to light being irradiated onto the photoelectric conversion layer, including a first electrode made of a light transparent conductive material, a second electrode, and a photoelectric conversion layer which is interposed between the first electrode and the second electrode and includes a thioindigo derivative.
8. The solar cell of the item 7 described above, wherein the thioindigo derivative in the photoelectric conversion layer includes at least one or more electron withdrawing groups.

The present technology is not limited to the embodiments described above and various configurations are possible within the scope which does not depart from the gist of the present technology.

The present disclosure contains subject matter related to that disclosed in Japanese Priority Patent Application JP 2011-165184 filed in the Japan Patent Office on Jul. 28, 2011, the entire contents of which are hereby incorporated by reference.

What is claimed is:

1. A photoelectric conversion device comprising a photoelectric conversion layer,
   wherein,
   the photoelectric conversion layer includes a thioindigo derivative with an ionization potential of −6.0 eV or less.

2. The photoelectric conversion device according to claim 1 wherein the thioindigo derivative contains at least one or more electron withdrawing groups.

3. The photoelectric conversion device according to claim 1 described above, wherein the thioindigo derivative has the following structure (1):

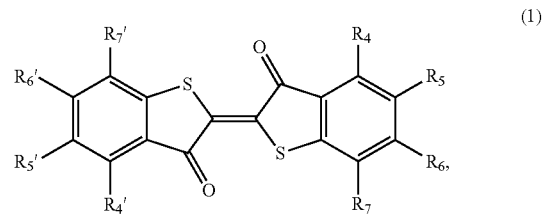

and
where $R_4$ to $R_7$ and $R_4'$ to $R_7'$ each represent a hydrogen, a halogen such or a methyl group.

4. The photoelectric conversion device according to claim 3, wherein at least one or more of $R_4$ to $R_7$ and $R_4'$ to $R_7'$ is an electron withdrawing group.

5. An imaging apparatus comprising:
   a light concentrating optical section configured to concentrate incident light;
   a solid state imaging device configured to receive light from the light concentrating optical section and carry out photoelectric conversion comprising (a) a plurality of pixels each pixel having a photoelectric conversion section, (b) a photoelectric conversion layer above the photoelectric conversion sections and (c) an organic color filter above the photoelectric conversion sections; and
   a signal processing section configured to a photoelectrically converted signal,
   wherein,
   the photoelectric conversion section includes a thioindigo derivative ionization potential of −6.0 eV or less.

6. The imaging apparatus according to claim 5 wherein the thioindigo derivative includes at least one or more electron withdrawing groups.

7. A solar cell comprising:
   a first electrode made of a light transparent conductive materiat;
   a second electrode; and
   a photoelectric conversion layer between the first electrode and the second electrode,
   wherein,
   the photoelectric conversion layer includes a thioindigo derivative ionization potential of −6.0 eV or less.

8. The solar cell according to claim 7 wherein the thioindigo derivative includes at least one or more electron withdrawing groups.

* * * * *